United States Patent
Jung et al.

(10) Patent No.: US 8,587,032 B2
(45) Date of Patent: Nov. 19, 2013

(54) TRANSISTOR WITH HIGH ELECTRON MOBILITY AND INHOMOGENEOUS LAYER RESISTANCE OF THE GUIDE CHANNEL

(75) Inventors: Helmut Jung, Ulm (DE); Hervé Blanck, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 13/638,965

(22) PCT Filed: May 12, 2011

(86) PCT No.: PCT/DE2011/075104
§ 371 (c)(1), (2), (4) Date: Oct. 2, 2012

(87) PCT Pub. No.: WO2012/022308
PCT Pub. Date: Feb. 23, 2012

(65) Prior Publication Data
US 2013/0049071 A1  Feb. 28, 2013

(30) Foreign Application Priority Data
May 18, 2010 (DE) .......... 10 2010 016 993

(51) Int. Cl.
*H01L 31/072* (2012.01)
(52) U.S. Cl.
USPC .......... 257/194; 257/183; 257/190; 257/192; 257/E29.246
(58) Field of Classification Search
USPC .......... 257/76, 183, 190, 192, 194, 134, 615, 257/E29.246; 438/172, 285, 478
See application file for complete search history.

(56) References Cited

U.S. PATENT DOCUMENTS

| | | | |
|---|---|---|---|
| 7,800,132 B2 | 9/2010 | Smorchkova et al. | |
| 2004/0144991 A1 | 7/2004 | Kikkawa | |
| 2004/0201038 A1 | 10/2004 | Kimura et al. | |
| 2006/0220065 A1 | 10/2006 | Kawasaki et al. | |
| 2007/0224710 A1 | 9/2007 | Palacios et al. | |
| 2008/0203433 A1 | 8/2008 | Sato | |
| 2008/0258150 A1* | 10/2008 | McCarthy et al. | 257/76 |
| 2009/0050938 A1* | 2/2009 | Miyoshi et al. | 257/194 |
| 2009/0072273 A1 | 3/2009 | Briere | |
| 2009/0230331 A1 | 9/2009 | Koudymov et al. | |
| 2011/0024796 A1* | 2/2011 | Miyoshi et al. | 257/194 |

FOREIGN PATENT DOCUMENTS

| | | |
|---|---|---|
| DE | 10 2008 052 595 | 4/2009 |
| DE | 11 2008 001 039 | 3/2010 |
| EP | 1 883 115 | 1/2008 |

OTHER PUBLICATIONS

International Search Report of PCT/DE2011/075104, date of mailing Jan. 31, 2012.
Meyer et al., Applied Physics Letters 89, 223523 (2006). Spec., p. 8.

* cited by examiner

*Primary Examiner* — Dung A. Le
(74) *Attorney, Agent, or Firm* — Collard & Roe, P.C.

(57) ABSTRACT

For an HEMT component, in particular on the basis of GaN, it is proposed, for the purpose of reducing field spikes in the conduction channel, in a partial section of the conduction channel between gate electrode and drain electrode, to set the sheet resistance of the conduction channel such that it is higher than in adjacent regions. Various measures for subsequently increasing the sheet resistance in an area-selective manner are specified.

25 Claims, 2 Drawing Sheets

Figure 1:
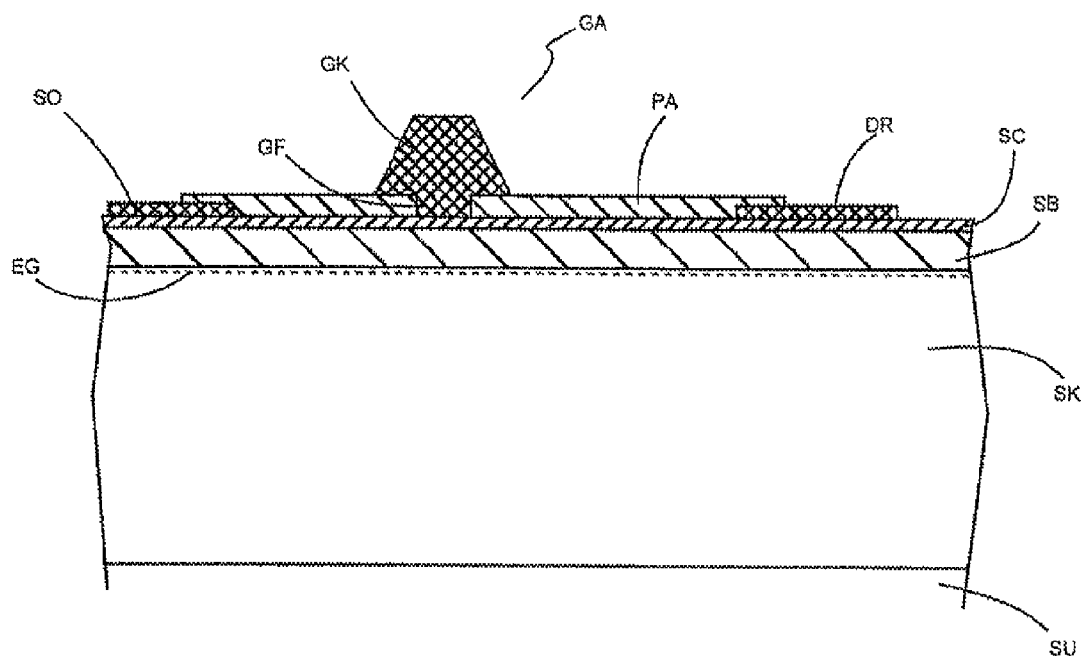

TRANSISTOR WITH HIGH ELECTRON MOBILITY AND INHOMOGENEOUS LAYER RESISTANCE OF THE GUIDE CHANNEL

CROSS REFERENCE TO RELATED APPLICATIONS

This application is the National Stage of PCT/DE2011/075104 filed on May 12, 2011, which claims priority under 35 U.S.C. §119 of German Application No. 10 2010 016 993.5 filed on May 18, 2010, the disclosure of which is incorporated by reference. The international application under PCT article 21(2) was not published in English.

The invention relates to a semiconductor component in the form of an HEMT.

HEMT components (high electron mobility transistor) contain a conduction channel of a very slight layer thickness, with a quasi two-dimensional electron gas, in which the electrons demonstrate very high mobility, at a layer boundary between two semiconductor layers that are deposited epitactically one above the other, with different band intervals. Parallel to the conduction channel, at a distance from one another, a source electrode and a drain electrode are connected with the conduction channel in electrically conductive manner. A gate electrode, which is electrically insulated with regard to the conduction channel and by means of which the current flow between source electrode and drain electrode can be controlled by means of the conduction channel, is disposed between source electrode and drain electrode.

Among the different semiconductor materials known for HEMT components, HEMT components on the basis of GaN are characterized, as compared with other materials, particularly those on the basis of GaAs, above all by a clearly higher RF power density. In addition, HEMT components based on a GaN basis can be operated at higher working temperatures, and are less susceptible to high-energy radiation, for example in space applications. The particular properties are attributable, above all, to the great band gap of the AlGaN that is precipitated onto GaN as the first semiconductor material, typically as a second semiconductor material. In this connection, the electrons are bound in the conduction channel particularly strongly, so that correspondingly higher electrical fields are applied and the components can be operated at higher source/drain voltages, thereby making it possible, in turn, to achieve higher output powers.

In general, electronic components degrade faster when the working temperature and the electrical stress (power) are elevated. The relevant temperatures result from the ambient temperature and from self-heating during electrical operation. For this reason, heat dissipation by way of suitable heat sinks, with a suitable housing technology, is an important topic in GaN power electronics.

While current flow during electrical operation elevates the temperature and thereby increases degradation, local electrical fields in the component are also important for long-term stability, referred to as reliability. Higher electrical fields accelerate degradation. Because not only high temperatures but also high field spikes are responsible for rapid degradation, both values are supposed to be kept as low as possible. It is known that in the operation of a GaN HEMT, the electrical fields between gate and drain are highest in the vicinity of the gate. Therefore both critical parameters for degradation, the temperature (because of the high power density) and the field itself are highest there. When a voltage is applied between source and drain or between gate and drain, the field distribution in the semiconductor is not constant, but rather has marked maximal values in the vicinity of the depletion region.

In order to reduce maxima of electrical fields, measures such as the selection of an asymmetrical gate, slanted gate design, or additional field plates at the gate electrode are known. Arrangements with field plates are described, for example, in DE 112008001039 T5 or DE 102008052595 A1.

It is furthermore known from US 2007/0224710 A1 to achieve an effect similar to the field plates by means of implantation of negative fluorine ions into the AlGaN layer or by means of surface charges at the surface of the AlGaN. In the same document, it is also proposed to sink the electrode foot of the gate electrode into a recess in the AlGaN layer, and thereby to position it closer to the conduction channel.

The present invention is based on the task of increasing the ability of HEMT components, particularly those on the basis of GaN, to withstand electrical stress and improving the long-term stability (reliability) of such components.

The invention is described in the independent claim. The dependent claims contain advantageous embodiments and further developments of the invention.

It surprisingly turns out that an increase in the sheet resistance of the conduction channel, which is actually undesirable for electrical components, improves the long-term stability, and that by means of a progression of the sheet resistance that is inhomogeneous in the current flow direction, it is possible to clearly increase the output power in a partial section between gate electrode and drain electrode, as compared with adjacent regions of the conduction channel having a higher sheet resistance, without the risk of damage to the HEMT component, as compared with HEMT components that otherwise have the same structure, with a constant sheet resistance between source electrode and drain electrode.

The sheet resistance is a characteristic value of the HEMT component, which can typically be determined, in the case of an open conduction channel, in other words one not constricted by a gate voltage, and is measured in ohms per surface area unit ($\Omega$/sq).

The partial section is advantageously shorter than the expanse of the conduction channel between the vertical projections of the gate electrode and the drain electrode, and advantageously amounts to at least 10%, particularly at least 20%, and at most 75%, particularly at most 50% of the said expanse, but can also extend to cover the entire said expanse. The partial section with the higher sheet resistance value can advantageously be disposed at the position at which the greatest field intensities are to be expected during operation of the component. The maximum of the field intensity typically lies close to the gate electrode and offset in the direction of the drain electrode from the former, whereby the precise position can vary, depending on the structure of the HEMT and electrical operating parameters. Depending on the type of measure taken to increase the sheet resistance, the partial section can overlap with the position of the electrode foot of the gate electrode, but is preferably disposed entirely in the region between the drain electrode and the electrode foot of the gate electrode. The center of gravity of the partial section can be offset in the direction of the drain electrode relative to the position of the maximum of the electrical field intensity.

The dependence of the sheet resistance in the conduction channel on various parameters is known and can be utilized to adjust a desired sheet resistance value. It is advantageous if measures are taken for the inhomogeneous progression of the sheet resistance, according to the invention, with the elevated resistance value in the partial section, which measures relate to the structure and/or composition of the layers that lie above the layer boundary. These layers can also contain, aside from the second semiconductor layer, particularly a further semiconductor layer and/or a passivation layer. In particular, one or more such layers can be structured differently above the partial section than above the regions adjacent to the partial section.

In order to increase the sheet resistance in the partial section, in a first advantageous embodiment, the layer thickness of the second semiconductor layer can be reduced above the partial section, whereby the reduction in the layer thickness advantageously amounts to at least 5%, particularly at least 10% of the layer thickness above the adjacent regions. The reduction in the layer thickness advantageously takes place by means of masking and partial removal by etching of the previously deposited second semiconductor layer, whereby the step of etching can take place before deposition of a further layer, particularly a further semiconductor layer and/or a passivation layer, or one or more layers already deposited above the second semiconductor layer are selectively removed again above the partial section. The thickness of the second semiconductor layers in the adjacent regions is advantageously less than 30 nm, particularly less than 25 nm.

In another embodiment, it can be provided to configure a passivation layer on the uppermost semiconductor layer, which can be the second semiconductor layer or a further semiconductor layer deposited above the latter, which can particularly be a GaN layer deposited onto an AlGaN layer, differently above the partial section than above the adjacent regions. In particular, in a first step, the passivation layer can be deposited over the entire area, uniformly, above the partial section and above the adjacent regions, partially or completely removed again in area-selective manner, and can be deposited again with different properties.

A different influence on the sheet resistance can be achieved, for example, by means of different process parameters during the first deposition of the passivation layer and during the subsequent renewed deposition. The dependence of the sheet resistance on the process parameters during deposition of a passivation layer is known, for example from Applied Physics Letters 89, 223523 (2006).

The passivation layer can have different compositions above the partial section, on the one hand, and above the adjacent regions, on the other hand; for example, it can consist of SiN and SiON and/or contain foreign atoms. Foreign atoms can also be introduced into a uniformly produced passivation layer subsequently, in area-selective manner.

In yet another embodiment, it can be provided, in order to increase the sheet resistance, to implant foreign atoms into the second semiconductor layer in area-selective manner, above the partial section, after deposition of the second semiconductor layer, and to thereby increase the sheet resistance in the partial section of the conduction channel, whereby the effect of the implanted atoms can particularly be based also on the production of lattice defects during implantation. In particular, positive ions of the elements O, H, Ar, N, or Zn are preferred for implantation. Implantation can also take place through a further semiconductor layer deposited above the second semiconductor layer.

The sheet resistance in the partial section is advantageously higher, by at least 4%, particularly by at least 8%, than the average sheet resistance in the adjacent regions of the conduction channel. Advantageously, the sheet resistance has a minimal value, over the progression of the conduction channel, in the region between source electrode and gate electrode, thereby advantageously making it possible to keep the feed resistance (source access resistance) particularly low. A particularly low sheet resistance between gate electrode and source electrode can also be achieved by means of measures for reducing the sheet resistance undertaken after deposition of the second semiconductor layer, in area-selective manner, above the region between source electrode and gate electrode.

Figure 2:
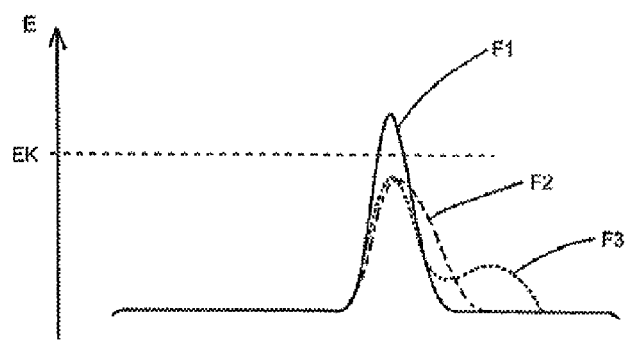
Figure 3:
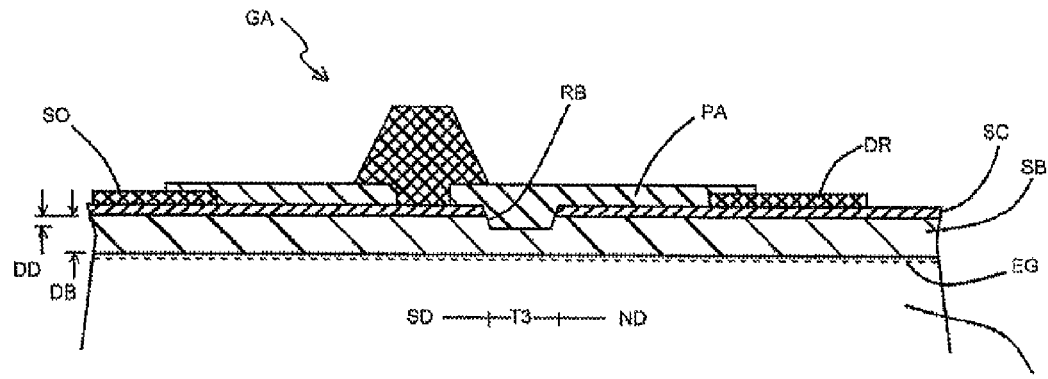
Figure 4:
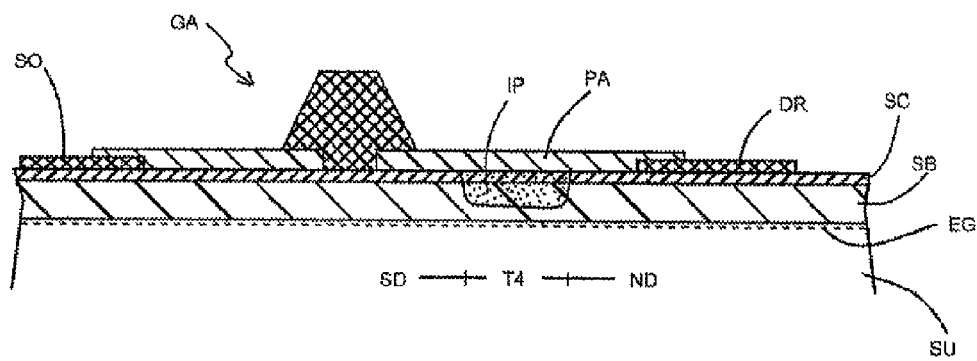
Figure 5:
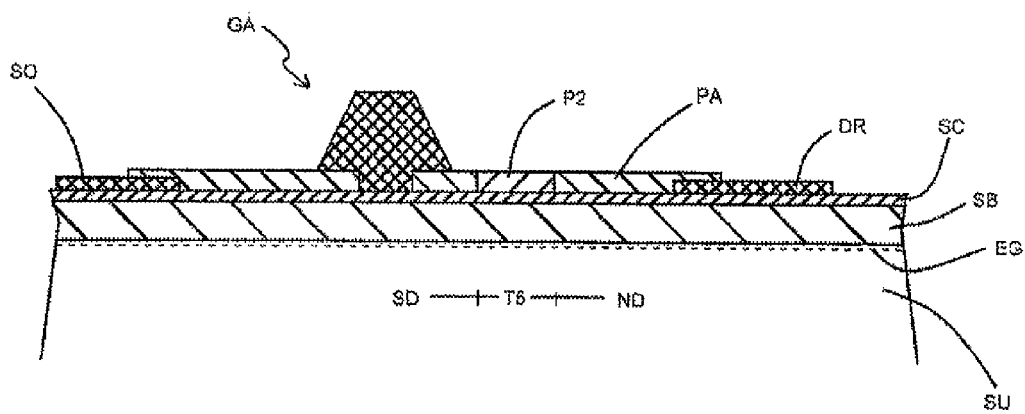

The invention will be explained in greater detail below, using preferred exemplary embodiments, making reference to the figures. These show:

FIG. 1 a schematic structure of an HEMT,

FIG. 2 field progressions in the conduction channel,

FIG. 3 an embodiment with a reduced barrier layer thickness,

FIG. 4 an embodiment with ion implantation,

FIG. 5 an embodiment with a locally changed passivation layer.

FIG. 1 schematically shows a fundamental structure of an HEMT on the basis of GaN, whereby a layer SK composed of GaN has grown on an SiC substrate SU. Above the layer SK as the first semiconductor layer, a second semiconductor layer SB usually referred to as a barrier layer is deposited, which possesses a greater band gap than the layer SK and is preferably composed of $Al_xGa_{1-x}N$, and in which the Al content x is advantageously less than x=0.3, particularly less than x=0.25. At the boundary surface between the first semiconductor layer SK and the second semiconductor layer SB, a quasi two-dimensional electron gas EG forms in a very narrow conduction channel perpendicular to the plane of the layer boundary SG, in which gas the electrons possess very high mobility parallel to the layer boundary SG.

Above the second semiconductor layer SB, a further semiconductor layer SC, which typically consists of GaN, can be deposited as a cover layer, usually also referred to as a cap layer.

On the uppermost semiconductor layer, which is provided by the cover layer SC in the example shown in the drawing, but which can also be the barrier layer SB itself, the source electrode SO and, laterally at a distance from it, a drain electrode DR are produced, which are connected with the two-dimensional electrode gas EG of the conduction channel, at low ohms. Between source electrode SO and drain electrode DR, a gate electrode GA is applied on the uppermost semiconductor layer, which electrode preferably forms a Schottky contact with the uppermost semiconductor layer, and, aside from leakage currents, does not possess any electrical connection with the electron gas EG in the conduction channel. In the example shown in the drawing, the gate electrode GA is structured as a T gate, which possesses a gate foot GF that is narrow in the lateral direction, on the uppermost semiconductor layer SC, and a gate head GK that is wider as compared with the gate foot GF.

The surface of the uppermost semiconductor layer SC is covered with a passivation layer PA, which reaches, in the lateral direction, from the gate foot GE to partly above the source electrode SO and the drain electrode DR. The gate electrode is advantageously produced after deposition of the passivation layer PA, whereby a window for the gate foot GE is produced in the passivation layer PA.

The second semiconductor layer SB has a lesser thickness, in comparison to the first semiconductor layer SK, of advantageously less than 30 nm, particularly less than 25 nm. A cover layer SC that might be present possesses an even lesser thickness of typically less than 4 nm.

For an HEMT, variations of the stated structure, particularly with additional layers or subdivisions of the layers shown in FIG. 1 into partial layers, are fundamentally known. The semiconductor layers SK, SB, and SC are advantageously undoped in the case of an HEMT structure on the basis of GaN.

In the case of a structure of an HEMT on the basis of GaN according to the principle of FIG. 1, a field progression along the conduction channel between source electrode SO and drain electrode DR as shown in FIG. 2 with a solid line and designated with F1 occurs, as indicated, for example, in US 2007/0224710 A1, which was already mentioned in the introduction. The field progression F1 shows a progression with a marked spike of the field intensity E close to the gate electrode GA. The peak value of the field intensity and the position between gate electrode and drain electrode depend on the structure of an HEMT component in detail, and on its operating parameters, in each instance.

At a high output power of an HEMT, the peak value of the field intensity, as shown in FIG. 2, can exceed a critical value EK, which can lead to reinforced degradation or even destruction of the component. In FIG. 2, two field progressions that are possible for RENT components according to the present invention are shown with broken lines, whereby the starting point was essentially the same source-drain voltage and the same output power as in the case of the field progression F1. The peak value of the field intensity is clearly reduced in the field progressions F2 and F3, and has particularly been lowered below the value EK.

In FIG. 3, a first embodiment of the invention is shown, in which the layer thickness DB of the second semiconductor layer above a partial section T3 of the conduction channel has been reduced by a dimension DD, in that after deposition of the semiconductor layer sequence SK, SB, SC above the partial section T3, local etching to remove the semiconductor material has taken place, whereby in this example, the cover layer SC has been locally removed completely, and the second semiconductor layer SB has been locally removed in area-selective manner, up to a depth DD. In another embodiment, etching for local reduction of the layer thickness of the second semiconductor layer SB can also take place before deposition of the further semiconductor layer SC, so that the depression in the second semiconductor layer SB then again would be covered with a cover layer that is deposited afterward, also in the region above the partial section T3. In the example shown in the drawing, the depression RB in the semiconductor layers is filled with material of a passivation PA deposited afterward.

FIG. 4 shows an exemplary embodiment of the invention, in which ions are implanted into a partial volume IP of the second semiconductor layer, above a partial section T4 of the conduction channel, in area-selective manner, which ions increase the sheet resistance in the partial section T4 of the conduction channel as compared with adjacent regions NS, ND, particularly by means of the occurrence of crystal damage during implantation. The ion implantation can take place through the cover layer SC, and advantageously does not reach through the entire layer thickness of the second semiconductor layer SB. FIG. 5 shows a preferred exemplary embodiment of the invention, in which, after deposition of the semiconductor layers SK, SB, and SC, as well as of the passivation layer PA, a region P2 of the passivation layer above the partial section T5 is structured with different layer parameters in the passivation layer than in the passivation layer above the adjacent regions NS, ND. For example, the passivation layer PA can consist, in conventional manner, of SiN, and the passivation layer P2 above the partial section T5 can consist of SiON, for which purpose, after deposition of the passivation layer PA composed of SiN over the entire area, a window is etched clear in it, above the partial section T5, and SiON as a passivation material is deposited selectively into this window or also over the entire area. Also, SiN can again be deposited into the opened window of the passivation layer PA for the passivation region P2, with different deposition parameters.

The characteristics that are indicated above and in the claims, and can be derived from the drawings, can advantageously be implemented both individually and in various combinations. The invention is not restricted to the exemplary embodiments described, but rather can be modified in many ways, within the scope of the abilities of a person skilled in the art.

The invention claimed is:

1. Semiconductor component in the form of an HEMT, with a first semiconductor layer and a second deposited over the latter, and a two-dimensional electron gas that forms in the first semiconductor layer, at the layer boundary to the second semiconductor layer, in a conduction channel, as well as with a source electrode and a drain electrode disposed laterally at a distance from one another, connected with the conduction channel in electrically conductive manner, and a gate electrode disposed between these, wherein the sheet resistance of the conduction channel is inhomogeneous in the current direction between source electrode and drain electrode, in such a manner that in a partial section of the conduction channel that lies between gate electrode and drain electrode, the sheet resistance of the conduction channel is elevated as compared with adjacent regions of the conduction channel that lie on both sides of the partial section, wherein the partial section is shorter than the expanse of the conduction channel between gate electrode and drain electrode.

2. Component according to claim 1, wherein the sheet resistance in the partial section is higher, by at least 4%, particularly by at least 8%, than the average sheet resistance in the adjacent regions.

3. Component according to claim 1, wherein the sheet resistance assumes a minimal value, within the progression between source electrode and drain electrode, in the region that lies adjacent in the direction toward the source electrode.

4. Component according to claim 1, wherein the partial section amounts to less than 60%, particularly less than 40% of the expanse of the conduction channel between gate electrode and drain electrode.

5. Component according to claim 1, wherein the length of the partial section amounts to at least 10%, particularly at least 20% of the expanse of the conduction channel between gate electrode and drain electrode.

6. Component according to claim 1, wherein the partial section lies closer to the gate electrode than to the drain electrode.

7. Component according to claim 1, wherein the partial section overlaps with the position of the gate electrode.

8. Component according to claim 1, wherein the second semiconductor layer has a lesser layer thickness above the partial section than above the adjacent regions.

9. Component according to claim 8, wherein the layer thickness of the second semiconductor layer is less by at least 5%, particularly by at least 10%, above the partial section than above the adjacent regions.

10. Component according to claim 8, wherein the region of the reduced layer thickness is disposed laterally offset relative to the gate electrode, in the direction of the drain electrode.

11. Component according to claim 1, wherein the maximal layer thickness of the second semiconductor layer between source electrode and drain electrode amounts to less than 30 nm, particularly less than 25 nm.

12. Component according to claim 1, wherein the second semiconductor layer contains additional components, introduced into it by means of ion implantation after deposition of the second semiconductor layer, above the partial section.

13. Component according to claim 12, wherein the second semiconductor layer has lattice damage caused by the ion implantation, above the partial section.

14. Component according to claim 12, wherein ions of the elements O, H, Ar, N, and/or Zn are introduced by means of ion implantation, as additional components.

15. Component according to claim 1, wherein a further semiconductor layer is deposited above the second semiconductor layer, as the uppermost semiconductor layer.

16. Component according to claim 15, wherein the further semiconductor layer is not present above the partial section.

17. Component according to claim 1, wherein a dielectric layer is deposited onto an uppermost semiconductor layer, as a passivation layer.

18. Component according to claim 17, wherein the passivation layer is different above the partial section, in terms of composition and/or parameters of the deposition process, from the passivation layer above the adjacent regions.

19. Component according to claim 18, wherein the passivation layer contains an additional component above the partial section, as compared with the passivation layer above the adjacent regions.

20. Component according to claim 17, wherein the passivation layer is formed, at least predominantly, from silicon nitride.

21. Component according to claim 20, wherein the passivation layer contains at least one of the elements O, Ar above the partial section.

22. Component according to claim 1, wherein the first semiconductor layer consists of GaN.

23. Component according to claim 22, wherein the second semiconductor layer consists of $Al_xGa_{1-x}N$.

24. Component according to claim 23, wherein the Al component x amounts to at most x=0.3, particularly at most x=0.25.

25. Component according to claim 1, wherein the second semiconductor layer is undoped.

* * * * *